United States Patent [19]

Ishaque

[11] Patent Number: 5,517,052

[45] Date of Patent: May 14, 1996

[54] DEEP-DIFFUSED PHOTOTRANSISTOR

[75] Inventor: Ahmad N. Ishaque, Albany, N.Y.

[73] Assignee: General Electric Company, Schenectady, N.Y.

[21] Appl. No.: 265,365

[22] Filed: Jun. 24, 1994

[51] Int. Cl.$^6$ .................................................. H01L 31/106
[52] U.S. Cl. ........................... 257/462; 257/291; 257/618
[58] Field of Search ................................... 257/462, 461, 257/291, 292, 293, 186, 481, 618

[56] References Cited

U.S. PATENT DOCUMENTS

| | | | |
|---|---|---|---|
| 3,769,546 | 10/1973 | Pecher et al. | 315/149 |
| 5,021,854 | 6/1991 | Huth | 357/30 |

FOREIGN PATENT DOCUMENTS 1215557  12/1970  Japan .

OTHER PUBLICATIONS

V. L. Gelezunas et al., "Uniform Large–Area High–Gain Silicon Avalanche Radiation Detectors From Transmutation Doped Silicon," American Institute of Physics, 1977, pp. 118–120.

Sze, S. M., "Physics of Semiconductor Devices," John Wiley, New York, 1981, pp. 783–787.

*Primary Examiner*—Sara W. Crane
*Attorney, Agent, or Firm*—Donald S. Ingraham; Marvin Snyder

[57] ABSTRACT

A large area deep-diffused phototransistor having a photosensitive area of at least 1 mm$^2$, and typically 25 mm$^2$ or larger includes a light entry layer of a deep-diffused p type semiconductor material; at least one well of an n type semiconductor material that is disposed in contact with the light entry layer so as to form a first p-n junction therebetween; and a respective readout contact comprising a p type semiconductor material that is disposed in the n type well so as to form a second p-n junction. The p type material light entry layer, the n type material well, and the p type material readout contact respectively comprises the collector, base and emitter of the phototransistor. The concentration of the p type dopant in the deep diffused light entry layer has a positive gradient extending from the first p-n junction towards the surface of the light entry layer such that the concentration of the p type dopant is greater the closer the proximity to that surface. The base width of the well is selected such that capacitance of the device is in the range between 0.5 pf/mm$^2$ and 2 pf/mm$^2$, whereby the phototransistor provides a desired frequency response up to several GHz.

25 Claims, 2 Drawing Sheets

DEEP-DIFFUSED PHOTOTRANSISTOR

BACKGROUND OF THE INVENTION

This application relates to solid state radiation detectors and in particular to phototransistors disposed in an array in an imager.

Devices used in radiation imaging for medical purposes, for example, must be able to detect incident optical photons or ionizing particles to provide a good image contrast. In such imaging devices it is often advantageous to employ radiation detection devices (e.g., photosensors) having internal gain; avalanche photodiodes (APDs) are commonly used in such devices to provide the desired detection sensitivity. In such imaging devices, it is desirable that the photosensor exhibit low noise and high gain. Certain devices, such as medical imagers (e.g., using gamma radiation), also require relatively large arrays (e.g., about 5 cm² or larger) of high quality, low noise photosensors.

Currently, the two types of APD designs in common use are the "deep diffused" structure and the "reach-through" structure. Deep diffused APDs, however, are typically not readily manufactured in large arrays as each device must be formed to have a precise bevel at the edge of each APD in the array. The bevel is required to reduce the peak surface field (i.e., the electric field across the p-n junction in the area where the p-n junction intersects the surface of the structure) of the APD well below the peak bulk electric field (i.e., the electric field across the p-n junction in the body of the device where the p-n junction is disposed substantially parallel to the surfaces of the device to which the bias is applied) so that the APD breaks down in the bulk instead of at the surface. Further, bevel formation requires mechanical operations which make the fabrication process non-standard in that the bevel for each APD must be individually formed. The non-standard methods required for bevel formation also results in reduced yield and non-uniform reliability of the devices formed, making the fabrication of large area arrays of this type of device expensive and difficult.

The reach-through APD structure generally does not require bevel formation. The reach-through type of APD typically has a shallow p-n junction that results in lower gain, a larger value of k (resulting in high noise devices), and greater temperature drift than deep diffused devices. Further, the active area of reach-through devices is small as compared to deep diffused devices. Array fabrication can be accomplished, although the process is time consuming and expensive as many steps are required to fabricate the array, and the resulting APDs in the array suffer the drawbacks noted above. Arrays in reach-through technology are also limited to a small active area.

Conventional phototransistors are not appropriate for use in large area imaging devices because the gain in each phototransistor is relatively small with respect to APDs, the devices have a very small photosensitive area, and the devices are not readily fabricated in large area arrays. Further, the frequency response of conventional phototransistors degrades rapidly as the size of the phototransistor is increased.

For most imager devices, it is thus desirable to have a photosensor array that is readily fabricated and that contains high quality individual photosensor pixels, that is photosensors that exhibit low noise and high gain. It is also desirable that the array be structurally strong, such as a block or planar structure in which few if any cuts are needed to provided efficient operation of the respective photosensor devices.

It is an object of this invention to provide a deep-diffused planar phototransistor that is adapted to be readily fabricated in a large area array.

It is a further object of this invention to provide a large area phototransistor, e.g., having a photosensitive area in excess of 1 mm², and typically 15 mm² or more, that exhibits good high frequency response.

SUMMARY OF THE INVENTION

This invention provides a large area deep-diffused phototransistor for detecting incident light when the phototransistor is biased at a selected biasing voltage. The phototransistor typically has a block shape with first and second surfaces disposed opposite one another. The phototransistor further comprises a light entry layer that comprises a deep-diffused p type semiconductor material and that makes up the first surface of the device; at least one well comprising an n type semiconductor material that is disposed in contact with the light entry layer so as to form a deep diffused first p-n junction therebetween, the first p-n junction having a parallel segment that is oriented substantially parallel to the first surface; and a respective readout contact comprising a p type semiconductor material that is disposed in the n type well so as to form a second p-n junction. The p type material light entry layer, the n type material well, and the p type material readout contact respectively comprise the collector, base and emitter of the phototransistor.

In accordance with this invention, the concentration of the p type dopant in the deep diffused light entry layer has a positive gradient extending from the deep diffused first p-n junction towards the first surface such that the concentration of the p type dopant is greater the closer the proximity to the first surface. The concentration of the n type dopant in the well is substantially constant throughout the n type material. The n type semiconductor material typically comprises neutron transmutation doped silicon and the p type dopant typically comprises gallium; alternatively, boron, aluminum, or the like can be used.

The phototransistor is large area, that is, the photosensitive region of the phototransistor has an area of not less than about 1 mm² and typically greater than about 15 mm². The light entry layer is disposed such that the distance from the first surface to the edge of the depletion layer inside the well is greater than about three absorption lengths of the incident radiation type in the p type material of the light entry layer. A voltage is applied to the collector of the phototransistor that is large (e.g., in the range between 200 volts and 700 volts for a 50 Ω-cm semiconductor material), but not of a magnitude to result in avalanche multiplication in the phototransistor or to cause punch-through of the base region of the transistor. When the selected biasing voltage is applied, the well comprises a depletion layer and a quasi-neutral region referred to as the effective base; the thickness of the well is selected such that capacitance of the phototransistor is in the range between 0.5 pf/mm² and 2 pf/mm², whereby the phototransistor provides a desired frequency response up to several GHz. The effective base width typically is in the range between about of 3 μm and 50 μm. The emitter width of the readout contact is typically in the range of 0.5 μm to 3 μm.

In one embodiment, a large area phototransistor comprises at least one well that extends from the second surface into the light entry layer such that the first p-n junction comprises a parallel segment (parallel to the first surface) and an oblique segment that extends between the parallel segment and the second surface. In this embodiment, electrical isolation between adjoining devices is provided by p type material of the light entry layer that extends around each well on the second surface. In another embodiment, the phototransistor array comprises a well layer disposed in contact with the light entry layer and, for each phototransistor in the array, a respective readout contact is disposed in the well layer along the second surface.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
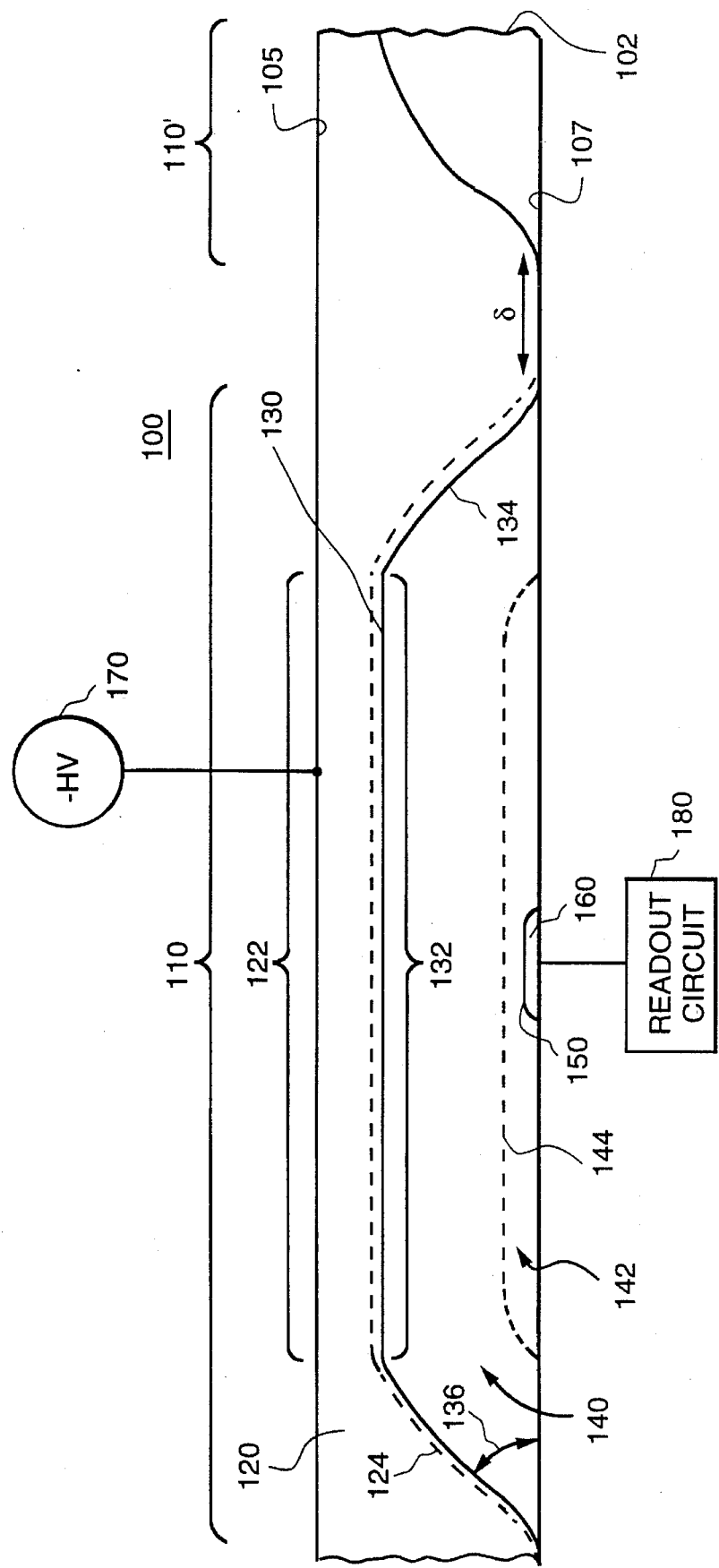
FIGS. 1 is a cross sectional view of a portion of a phototransistor array in accordance with one embodiment of this invention.

A deep diffused planar phototransistor array 100 comprising a plurality of phototransistor devices 110 is illustrated in FIG. 1. Each phototransistor device 110 comprises a light entry layer 120, a well 140, and a readout contact 160, which respectively form the collector, base, and emitter of the phototransistor. Although array 100 typically comprises a plurality of phototransistors, the device may comprise only one phototransistor. For purposes of illustration and not limitation, one phototransistor 110 will be described herein.

Array 100 typically comprises a block 102 in which light entry layer 120 comprises a deep diffused p type semiconductor material, well 140 comprises an n type semiconductor material, and readout contact 160 comprises a p type semiconductor material. Block 102 has a first surface 105 and a second surface 107 that are disposed opposite one another and that are substantially parallel to one another. "Substantially parallel" typically refers to surfaces that lie in planes that are within a range of about plus or minus 2° of being parallel to one another.

"Deep diffused", as used herein, refers to a doped area in which a desired dopant has been introduced into the semiconductor material to alter its doping profile and to establish a p-n junction at a substantial depth from the original surface through which the diffusion took place. Typically, the substantial depth of the p-n junction from the original surface through which the diffusion occurred is not less than about 60 µm from that original surface. In the finished device, the original surface through which the diffusion occurred may have been removed in fabrication to provide a desired device structure. The doping gradient (i.e. the concentration profile of the diffused dopant at different distances from the original doping surface) in the doped material remaining in the finished device, which typically corresponds to a complementary error function or a Gaussian distribution, remains unique to the deep diffused process by which it was obtained. Such a profile is not attainable in a non-deep diffused process (e.g., by doping a thinner section of the semiconductor material) because it represents the tail of a Gaussian (or, a complementary error function) distribution. The desired deep diffused doping gradient is typically obtained using deep diffused methods of fabrication as described in copending case Ser. No. 08/223,397, filed 4 Apr. 1994, and entitled "Deep-Diffused Planar Avalanche Photodiode and Method for Fabrication", which is assigned to the assignee herein and is incorporated by reference. "N type semiconductor material" or the like refers to semiconductor material that is doped so that it exhibits n type conductivity, that is, electrons comprise the majority carrier and the holes in the material comprise the minority carrier (similarly, "p type semiconductor material" or the like refers to semiconductor material in which holes comprise the majority carrier and electrons comprise the minority carrier).

The following design and operating criteria are important in fabrication of phototransistors in accordance with this invention so as to provide the improved operating characteristics. For example, the important figures of merit of a phototransistor are its low frequency common emitter gain ($\beta$), the cut-off frequency $f_T$ (the frequency at which the gain becomes unity), and the dark current $I_L$. The low frequency gain ($\beta_0$) of a transistor may be expressed as:

$$\beta_0 = (\gamma \alpha_T M)/(1 - \gamma \alpha_T M)$$

in which $\gamma$ is the emitter injection efficiency, $\alpha_T$ the base transport factor, and M the avalanche gain. If the transistor is operated well below the breakdown voltage, the avalanche gain is unity. The quantities $\gamma$ and $\alpha_T$ are always less than unity and, for a large gain, it is desirable to make them as close to unity as possible. To get the emitter injection efficiency close to unity, the emitter doping must be much larger than the base doping level and the emitter thickness must be very small as compared to the base thickness. To make the base transport factor close to unity, the minority carrier diffusion length in the base must be much larger than the base thickness. The minority carrier diffusion length is given by:

$$L = (D\tau)^{1/2}$$

in which D is the diffusion coefficient and $\tau$ is the carrier lifetime. It is therefore desirable to have a long minority carrier lifetime in the base to get a large gain. If a small gain is required, the conditions discussed above must be reversed.

The cut-off frequency of the transistor is given by:

$$f_T = (1/2\pi)(g_m/C_{BC} + C_\pi)$$

in which $C_{BC}$ is the collector to base capacitance, $C_\pi$ is the base charging capacitance, and $g_m$ is the transconductance ($g_m$ is a constant that depends on the biasing point). For a phototransistor, the collector-base junction must have a large area (A) because this junction is the photosensitive junction. The capacitance of the collector-base junction is given by:

$$C_{BC} = A\epsilon/d$$

in which A is the junction area, $\epsilon$ is the dielectric constant, and d is the depletion layer width (i.e., thickness). Hence, to achieve a large cut-off frequency, a large depletion layer thickness is required, particularly if the area A is large.

In accordance with this invention, the p type material of light entry layer 120 and the n type material of well 140 are disposed in proximity with one another such that a deep diffused first p-n junction 130 is disposed therebetween (that is, the p-n junction is originally formed in a deep diffused process as noted above such that the doping concentration of the p dopant corresponds to a desired gradient, which in turn provides the desirable depletion layer depth and operating characteristics of the junction). The n type semiconductor material comprising well 140 typically comprises neutron transmutation doped silicon having a substantially uniform n type doping level throughout the n type regions of the block and a resistivity typically in the range between about 20 Ω-cm and 200 Ω-cm. The p type material of light entry layer 120 typically comprises neutron transmutation doped silicon further doped in a deep diffusion process with a p type dopant such as gallium, aluminum, or the like, such that the p type dopant has a positive gradient, that is the gradient of concentration of p type dopant is a function of the distance from first surface 105 whereby dopant concentration decreases farther from first surface 105 in accordance with the Gaussian or complementary error function noted above. First p-n junction 130 comprises a parallel segment 132 and an oblique segment 134 extending from parallel segment 132 to second surface 107. Respective oblique segments 134 typically join second surface 107 at an intercept angle 136 that is oblique, and typically is not greater than about 60° (oblique segments 134 typically have two arcuate-shaped sub-segments having radii which are not necessarily constant). The p type material of readout contact 160, which is typically formed in an ion implant procedure, is disposed in proximity with n type material of well 140 such that a second p-n junction 150 is formed therebetween. The concentration of the p type dopant in the readout contact 160 is typically greater than $10^{18}$ atom/cm$^3$ and the thickness of the readout contact is typically between 0.5 μm and 3 μm.

The thickness of light entry layer 120 in an absorption region 122, e.g., the region between a collector depletion layer edge 124 (described further below) and first surface 105, is typically relatively thin, having a thickness such that the total thickness of light entry layer 120 plus the depletion region formed when the device is biased at its selected biasing voltage (as described below) is greater than about 3 to 5 times the absorption thickness of the radiation that the phototransistor is designed to detect. The gradient formed by the doping profile results in a small electric field in the collector region, which aids the collection of carriers generated near the surface. For example, for optical photons of 550 nm wavelength, the absorption length is about 1 μm in the silicon of phototransistor 110, and absorption region thickness is between about 1 μm and 3 μm. Further, by way of example and not limitation, the thickness of well 140, that is the distance between first p-n junction parallel segment 132 and second surface 107, for a 50 Ω-cm semiconductor material and 300 V operating voltage, would be greater than about 50 μm, and typically between about 60 μm and 75 μm. The thickness is selected in the phototransistor design process to support a relatively large biasing voltage (e.g., 500 V) and to provide a relatively small effective base width, e.g., 3 μm to 50 μm (effective base width refers to the width (or thickness) of a neutral or space charge-free region 142 (non-depletion layer portion) (defined in FIG. 1 by a well (or base) depletion layer boundary 144) of the well outside of the emitter implant when the transistor is biased).

The thickness of well 140 is chosen such that the well region outside of the emitter implant (contact readout 160) can support the operating voltage without punch-through and the effective base width (thickness) is between about 1 μm and 10 μm. For example, if the collector-base junction has a breakdown voltage given by $BV_{CBO}$ (collector-to-base breakdown voltage when emitter is open circuited), then, when the base is open-circuited, which is the mode in which a phototransistor operates, the breakdown voltage of the collector-base junction, $BV_{CEO}$, is given by the relationship:

$$BV_{CEO} \approx (BV_{CBO})/(\beta)^{1/4}$$

in which β is the common-emitter gain. Hence, for a large gain the maximum permissible collector voltage is significantly smaller than the ideal collector breakdown voltage. The well thickness should be designed to support the voltage $BV_{CEO}$ such that at the operating voltage ($V_{operating} < BV_{CEO}$) the effective base-width is between 1 μm and 10 μm. The effective base width must be much smaller than the minority carrier diffusion length in the base in order to obtain a large common-emitter gain β.

The lateral extent of well 120, that is the distance from oblique p-n junction segment 134 on one side of the well to the oblique p-n junction segment 134 on the opposite end of the well, depends on the use of the device in which the phototransistor will be incorporated. For example, in a gamma camera type of application, a common photosensor size would be 4 mm$^2$. Commonly the plan-view shape of well is square, rectangular, or circular. In accordance with this invention, phototransistor 110 has a large photosensitive area, that is, the area corresponding to absorption region 122, has an area not less than about 1 mm$^2$ and typically 15 mm$^2$ or more. The photosensors of this invention provide superior performance characteristics (e.g., cut-off frequencies and the like) even at larger sizes, such as 50 mm$^2$, and very large photosensors are readily constructed, e.g., having areas of 100 mm$^2$ or larger. Readout contact 160 typically is centered in neutral region 142 of well 140, has a thickness in the range between about 0.5 μm and 3 μm, and has a lateral extent such that it covers less than about 70% of neutral region 142 of well 140 (other factors being equal, it is desirable that readout contact cover as small a portion of neutral region 142 as feasible to minimize the emitter-base capacitance).

Light entry layer 120, well 140, readout contact 160 and the p-n junctions formed therebetween thus comprise a p-n-p transistor that, when properly biased, is adapted to absorb incident radiation and generate a corresponding amplified output signal. For example, a voltage source 170 is typically coupled to light entry layer 120 (via a thin p+ semiconductor layer (not shown)) to provide a desired biasing voltage, such as a negative voltage in the range between about −200 volts and −700 volts for a 50 Ω-cm semiconductive material. Readout contact 160 is electrically coupled to a readout circuit 180 to provide a phototransistor output signal that corresponds to optical photons incident on phototransistor 110.

When the biasing voltage is applied to phototransistor 110, a depletion layer is established on the collector (light entry layer 120) side and the base (well 140) side of first p-n junction 130. A collector depletion layer edge 124 is shown in FIG. 1 to outline the boundary of the depletion region in the p type semiconductor material of the light entry layer. Collector depletion layer edge 124 has a shape that conforms to that of first p-n junction 130 except where the junction is curved or where it intersects surface 107 and is disposed in light entry layer 120 approximately 2 to 20 μm from p-n junction 130. Base depletion layer edge 144 marks the boundary between the base depletion region in well 140 and the neutral region 142 in well 140; the depletion layer in well 140 typically has a width of about 50 μm or more under a biasing voltage of about 200 volts to 700 volts.

When the selected biasing voltage is applied, well 140 comprises the depletion layer and quasi-neutral region 142, which is referred to as the "effective base". In accordance with this invention, the large area of the collector-base junction does not degrade the high frequency response of the phototransistor because, unlike in conventional phototransistors, a relatively large voltage can be applied to the collector to provide a wide depletion region (typically ≧50 μm). This wide depletion region is made possible as a result of the deep diffused nature of p-n junction 130 and by the proper termination of the collector-base junction. In addition to the large sensitive area and the large cut-off frequency, the deep-diffused phototransistor also exhibits a reproducible low frequency gain because, despite the large depletion layer width, the effective base width can be tightly controlled. The effective base width control is made possible by the high uniformity of the starting NTD material and the excellent uniformity of the junction profile obtained by deep gallium diffusion. In addition, the reproducible low frequency gain can be made large because the minority carrier lifetime in deep gallium diffused NTD silicon, with appropriate gettering, is typically found to be greater than a few hundred microseconds. Therefore, for an effective base width (thickness) in the range of 3 μm to 50 μm, the hole diffusion length in the base is much larger than the effective base width, giving rise to a large low frequency gain.

Phototransistors 110 are typically fabricated in an array of similar devices for use in large area radiation detectors (e.g., detectors typically having an area of in the range between 1 $cm^2$ and 1000 $cm^2$ and that require several phototransistor arrays) with the respective phototransistors disposed in a pattern of rows and columns. In the embodiment of this invention illustrated in FIG. 1, the p type material comprising light entry layer 120 is disposed around the n type material of well 140 at second surface 107; this arrangement provides electrical isolation of each well 140 and thus minimizes cross-talk between adjacent devices in the array. Due to limitation of the deep diffusion process used in the typical fabrication process for light entry layer 120 (which process is more fully described in copending application Ser. No. 08/223,397, filed 4 Apr. 1994, noted above, and incorporated herein by reference), the amount of deadspace "δ" between respective phototransistors is typically between about 5 μm and 40 μm.

Figure 2:
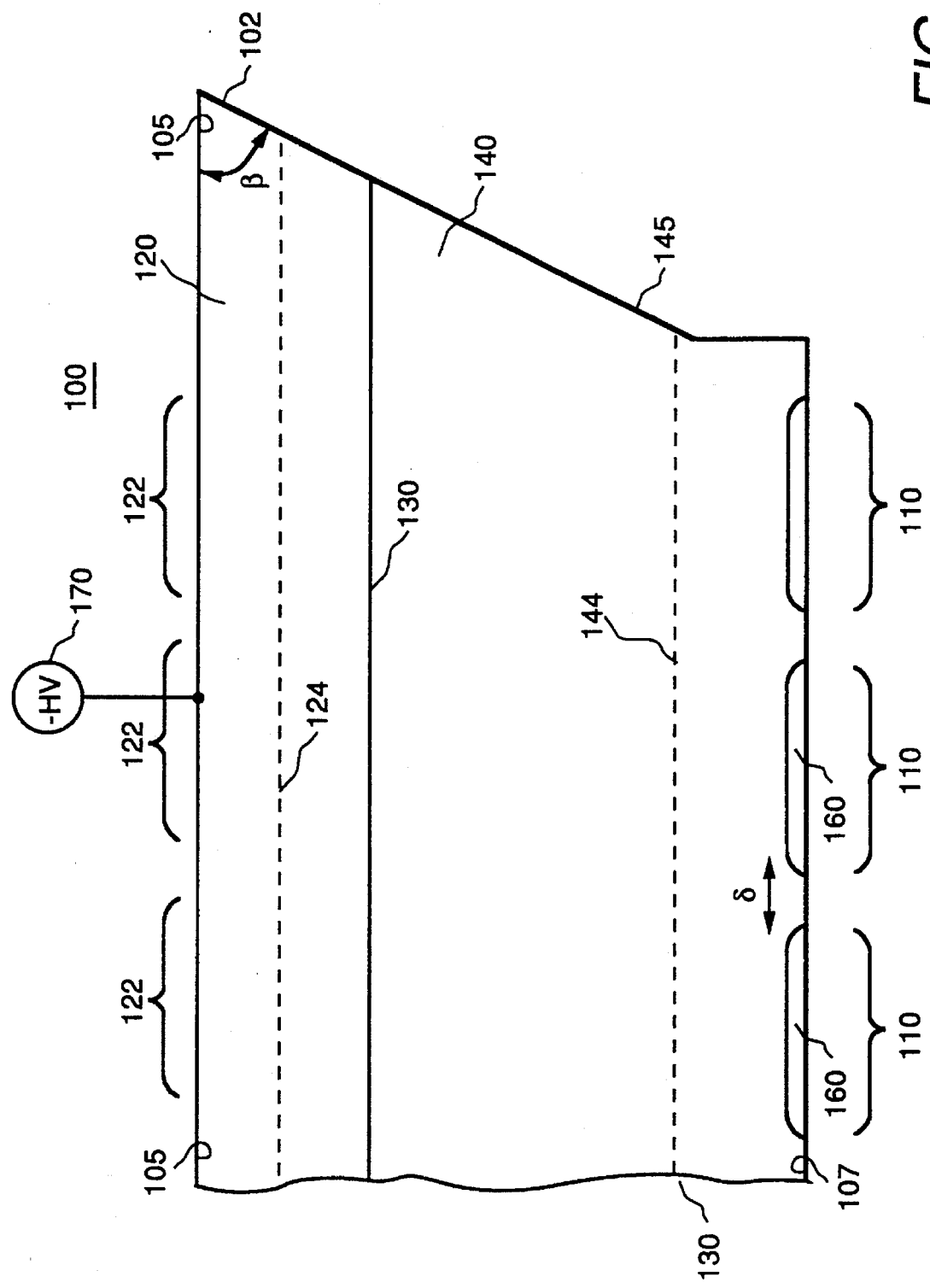
FIG. 2 is a cross sectional view of a portion of a phototransistor array in accordance with another embodiment of this invention.

A second embodiment of a phototransistor array in accordance with this invention is illustrated in FIG. 2. In this embodiment, light entry layer 120 comprising deep diffused p type semiconductor material (as described above) is disposed adjacent to a substantially planar well layer 140 comprising n type semiconductor material, typically neutron transmutation doped silicon (as described above). Readout contacts 160 comprising p type semiconductor material are disposed along second surface 107; each readout contact corresponds to a respective phototransistor 110. The collector depletion layer edge 122 and the base depletion layer edge 144 are also illustrated. In this structure p type material of light entry layer does not extend to second surface 107 to provide electrical isolation between respective phototransistors 110; in this array deadspace δ corresponds to the distance between respective readout contacts 160 and is selected to avoid undue parasitic transistor effect between adjacent readout contacts. The lateral distance between adjacent readout contacts typically is greater than the lateral hole diffusion length to avoid communication between the devices; as these devices exist near the surface of block 102, the hole lifetimes are short and the lateral hole diffusion length is less than a micron. To obtain satisfactory isolation, the lateral resistance between adjacent readout contacts should be about 100 times greater than the forward resistance to the nearest readout contact. Typical deadspace distances between adjacent readout contacts are thus in the range of 10 μm to 300 μm.

The end regions 145 on the edge of block 102 of the device illustrated in FIG. 2 are beveled to provide satisfactory device operation. As shown in the example illustrated in FIG. 2, block 102 comprises a junction termination structure 145 such as beveled ends at each end of the block (a representative one of which is shown in the Figure) that extend from second surface 107 to a point about midway in the thickness of well layer 140; the bevel angle β is selected to provide the desired junction termination (e.g., reduced surface field), and is in the range between about 30° and 60°, and is commonly about 45°.

In accordance with this invention, phototransistor 110 can be designed to operate in a transistor mode, in which case phototransistor 110 is designed to have a desired gain in accordance with transistor design criteria described earlier or, alternatively, the phototransistor 110 is designed to operate in an avalanche mode, in which case transistor design criteria are used to design a device having a common emitter gain β near unity. In accordance with this invention, the base of the phototransistor is kept floating in the photodetection mode. When light is absorbed in the collector region or the collector-base depletion layer, a photocurrent ($I_{ph}$) corresponding to the carriers generated by the incoming radiation flows in the collector. In addition, the electrons generated in the depletion layer are swept into the base and lower the base-emitter potential leading to hole injection from the emitter across the base and into the collector. The total current is expressed as:

$$I_c = (1+\beta)I_{ph}$$

in which β is the common-emitter current gain of the transistor. Therefore, the primary photocurrent is multiplied by the factor (1+β) and the device provides internal gain.

One advantage of the phototransistor of the present invention is the ability to fabricate a large area phototransistor that has a high frequency response, e.g., up to several GHz. The frequency response of the transistor is a function of the collector-base capacitance of the transistor (as described above), and the capacitance of the collector-base junction of the phototransistor is a function of the photosensitve area of the phototransistor and the total width (or thickness) of the depletion layer (the equation for which is discussed above). The phototransistor of this invention, when biased at the selected biasing voltage described above, typically has a collector-base capacitance in the range between 0.5 pf/$mm^2$ to 2 pf/$mm^2$. In a conventional phototransistor in which first p-n junction 130 is not formed in a deep diffused process, the capacitance of the device goes up as the area is increased, with a concomitant decrease in phototransistor frequency response, because the depletion layer width is small. In accordance with the present invention, however, a large (as described herein) depletion layer width is made possible through the use of the high voltage deep diffused first p-n junction, which is properly terminated, and fabrication of devices having a depletion layer width 20 times larger than a conventional device is possible, resulting in a large cut-off frequency despite the large sensitive area.

The present invention utilizes the high uniformity of NTD silicon and the uniformity of deep gallium diffusion to provide a phototransistor structure having a large sensitive area with desirable performance characteristics that are not possible with conventional technology. For example, the large capacitance of a large area device is offset by a large depletion layer width made possible by the design of the collector-base junction to support a high voltage with a small surface and peripheral field. The small surface and peripheral fields are obtained through the positive doping gradient in the well combined with the fact that the curvature of the arcuate shaped portion of the p-n junction 130 (FIG. 1) is either centered in the well or, alternatively, the arcuate shaped portion is formed by a deeper diffusion than the parallel plane portion of the junction, leading to a small peripheral field. In addition, the p-n junction intersects the surface at an acute angle (as measured inside the well), leading to self-termination and a small surface electric field. Moreover, the uniformity of NTD silicon and deep gallium diffusion, combined with the large minority carrier diffusion length, provides a phototransistor structure having a large gain and excellent gain uniformity that is not achievable in conventional devices.

The disposition of the emitter and the resulting floating base operation results in breakdown voltage considerations (as noted above) and dimensional design criteria significantly different from that of an avalanche photodiode (APD). Further, the operation of the phototransistor is fundamentally different from that of an APD; the phototransistor provides gain by transistor action whereas an APD utilizes avalanche multiplication. The present invention improves photodetector technology as it provides a device having a large area, large gain, and large frequency response, and further has the following advantages over conventional APD technologies: (i) low voltage operation as compared to an APD; (ii) no excess noise, something that is inherent in an APD because of the avalanche process; (iii) greater stability in voltage and temperature drift; (iv) greater reliability and higher yields in fabrication because the device is not operated at near-breakdown voltages, which results in less stringent passivation requirements; (v) less susceptibility to ionizing particle-related burnout due to operation at voltages causing smaller fields in the device as compared to an APD; and, (vi) simpler fabrication techniques that enable production at lower costs.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A large area deep-diffused phototransistor for detecting incident radiation when biased at a selected biasing voltage, said phototransistor comprising:
   first surface and a second surface, said second surface being disposed opposite to said first surface;
   a light entry layer comprising a p type semiconductor material, said light entry layer further comprising said first surface;
   at least one well comprising an n type semiconductor material, said well disposed in contact with said light entry layer such that a deep diffused first p-n junction is formed therebetween, said first p-n junction comprising a parallel segment aligned substantially parallel to said first surface, said well further comprising at least a portion of said second surface, said first p-n junction further comprising an oblique segment disposed between said parallel segment and said second surface such that said first p-n junction is disposed at an oblique intercept angle with respect to the plane of said second surface at the intersection between said first p-n junction and said second surface; and
   a respective readout contact comprising a p type semiconductor material disposed in each of said at least one wells, each of said readout contacts extending into said respective well from said second surface and disposed in contact with the well n type semiconductor material so as to form a second p-n junction;
   said light entry layer, said at least one well, and said respective readout contact comprising a collector region, a base, and an emitter, respectively, of said phototransistor, each of said phototransistors having a respective photosensitive region having an area of not less than about 1 $mm^2$,
   each of said wells further comprising a depletion layer when biased at said selected biasing voltage such that the collector-base capacitance of said device is within a range of 0.5 $pf/mm^2$ to 2 $pf/mm^2$.

2. The device of claim 1 wherein said p type semiconductor material comprising said light entry layer has a deep diffused positive doping gradient such that the concentration of the p type dopant is greater farther from said first p-n junction in accordance with a deep diffused doping profile.

3. The device of claim 2 wherein the doping concentration of said n type semiconductor material comprising said well layer is substantially constant therethrough.

4. The device of claim 1 wherein each of said phototransistors further comprises a respective photosensitive region having an area of not less than about 50 $mm^2$.

5. The device of claim 1 wherein the thickness of said light entry layer plus the depletion region formed in said well when said phototransistor device is biased at said selected biasing voltage is greater than about 3 to 5 times the absorption thickness of said incident radiation.

6. The device of claim 1 wherein the base width of each of said n type wells is greater than the emitter width of the respective readout contact in said well.

7. The device of claim 6 wherein said n type semiconductor material comprises neutron transmutation doped silicon having a resistivity in the range between about 20 $\Omega$-cm and 200 $\Omega$-cm.

8. The device of claim 7 wherein the effective base width of each of said phototransistors biased at said selected biasing voltage is in the range between about 3 μm and 50 μm.

9. The device of claim 8 wherein the thickness of the readout contact is in the range between 0.5 μm and 3 μm.

10. The device of claim 9 wherein said readout contact is centered in a neutral region of said well disposed around said emitter of said phototransistor.

11. The device of claim 10 wherein each respective readout contact has an area on said second surface that is less than about 70% of the area of said neutral region on said second surface.

12. A large area planar deep-diffused phototransistor for detecting incident radiation when biased at a selected biasing voltage, said phototransistor comprising:
   a transistor block having a first surface and a second surface, said second surface being disposed opposite to said first surface;
   a light entry layer comprising a p type semiconductor material, said light entry layer further comprising said first surface, said p type semiconductor material comprising said light entry layer having a deep diffused positive doping gradient in accordance with a deep diffused doping profile such that the concentration of the p type dopant is greater closest to said first surface;
   a respective well comprising neutron transmutation doped silicon n type semiconductor material having a resistivity in the range between about 20 $\Omega$-cm and 200 $\Omega$-cm, the doping concentration of said n type semiconductor material comprising said well layer being substantially constant therethrough, said well extending from a well-portion said second surface into said light entry layer such that a deep diffused first p-n junction is formed therebetween along a collector-base boundary of said well, said first p-n junction comprising a parallel segment aligned substantially parallel to said first surface, said well portion of said second surface being surrounded on said second surface by a respective transistor isolation portion of said light entry layer so as to electrically isolate said well along said second surface, each respective first p-n junction further comprising an oblique segment disposed between the respective parallel segment of said first p-n junction and said block second surface such that said p-n junction is disposed at an oblique intercept angle with respect to the plane of said second surface at the intersection between said first p-n junction and said second surface; and a respective readout contact comprising a p type semiconductor material disposed in each of said respective wells, each of said readout contacts extending into said respective wells from said second surface;

said light entry layer, said respective well, and said respective readout contact comprising a collector region, a base, and an emitter, respectively, of said phototransistor;

each of said phototransistors further comprising a photosensitive region having an area of not less than about 1 mm² and having a base width is selected such that the capacitance of said device is in a range between about 0.5 pf/mm² and 2 pf/mm², the effective base width of each of said phototransistors when biased at said selected biasing voltage is in the range between about 3 μm and 50 μm, each of said wells further comprising a depletion layer when biased at said selected biasing voltage having a thickness in the range between about 30 μm and 200 μm.

13. The device of claim 12 wherein said oblique intercept angle, as measured from the interior of said well, is not greater than about 60°.

14. The device of claim 12 wherein said emitter thickness is in the range between about 0.5 μm and 3 μm.

15. The device of claim 12 wherein the thickness of said light entry layer plus the depletion region formed in said well when said phototransistor device is biased at said selected biasing voltage is greater than about 3 to 5 times the absorption thickness of said incident radiation.

16. The device of claim 12 comprising a plurality of said phototransistor arranged in an array such that deadspace between adjoining phototransistors is in the range between about 5 μm and 40 μm.

17. The device of claim 16 wherein each of said phototransistors in said array is isolated along said second surface by p type material of said light absorbing layer.

18. A planar deep-diffused large area phototransistor array for detecting incident radiation when biased at a selected biasing voltage, said phototransistor array comprising:

an array block having a first surface and a second surface, said second surface being disposed opposite to said first surface;

a light entry layer comprising a p type semiconductor material, said light entry layer further comprising said first surface of said array block;

a well layer comprising an n type semiconductor material, said well layer being disposed in contact with said light entry layer such that a deep diffused first p-n junction is formed therebetween along a collector-base boundary of said well aligned substantially parallel to said first surface, said well layer further comprising respective well-portions said second surface; and for each phototransistor in said array, a respective readout contact comprising a p type semiconductor material extending into said well layer from said second surface;

said light entry layer, said well layer, and said respective readout contact comprising a collector region, a base, and an emitter, respectively, of said phototransistor;

each of said phototransistors further comprising a photosensitive region having an area of not less than about 1 mm².

19. The device of claim 18 wherein said p type semiconductor material comprising said light entry layer has a deep diffused positive dopant gradient such that the concentration of the p type dopant is greater farther from said first p-n junction in accordance with a deep diffused doping profile.

20. The device of claim 19 wherein the doping concentration of said n type semiconductor material comprising said well layer is substantially constant therethrough.

21. The device of claim 18 wherein the effective base width of each of said phototransistors biased at said selected biasing voltage is in the range between about 3 μm and 50 μm.

22. The device of claim 21 wherein said well layer further comprises a depletion layer when biased at said selected biasing voltage having a width in the range between about 30 μm and 200 μm.

23. The device of claim 18 wherein the thickness of said light entry layer plus the depletion region formed in said well when said phototransistor device is biased at said selected biasing voltage is greater than about 3 to 5 times the absorption thickness of said incident radiation.

24. The device of claim 18 wherein each of said readout contacts has an emitter thickness in the range between 0.5 μm and 3 μm.

25. The device of claim 24 wherein the spacing between respective readout contacts along said second surface is in the range between about 10 μm and 100 μm.

* * * * *